United States Patent
Xu et al.

(10) Patent No.: US 10,374,427 B2
(45) Date of Patent: Aug. 6, 2019

(54) PARAMETER TUNING APPROACH FOR BYPASS DAMPING FILTER TO SUPPRESS SUBSYNCHRONOUS RESONANCE IN POWER SYSTEMS

(71) Applicant: ZHEJIANG UNIVERSITY, Hangzhou, Zhejiang Province (CN)

(72) Inventors: Zheng Xu, Hangzhou (CN); Shijia Wang, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 144 days.

(21) Appl. No.: 15/523,135

(22) PCT Filed: Apr. 11, 2016

(86) PCT No.: PCT/CN2016/078929
§ 371 (c)(1),
(2) Date: Apr. 28, 2017

(87) PCT Pub. No.: WO2016/202063
PCT Pub. Date: Dec. 22, 2016

(65) Prior Publication Data
US 2017/0331289 A1    Nov. 16, 2017

(30) Foreign Application Priority Data
Jun. 19, 2015 (CN) .......................... 2015 1 0350906

(51) Int. Cl.
*H02J 3/24* (2006.01)
*H02H 9/08* (2006.01)
(Continued)

(52) U.S. Cl.
CPC ............... *H02J 3/24* (2013.01); *H02H 9/007* (2013.01); *H02H 9/08* (2013.01); *H02J 3/01* (2013.01);
(Continued)

(58) Field of Classification Search
CPC ...... H02H 9/08; H02J 3/01; H02J 3/24; H03J 3/22; H04B 15/02
See application file for complete search history.

(56) References Cited

U.S. PATENT DOCUMENTS 4,551,780 A * 11/1985 Canay ..................... H02H 7/06
174/DIG. 17
4,724,333 A     2/1988 Hedin
(Continued)

FOREIGN PATENT DOCUMENTS

CN    101895117 A    11/2010
JP      5340841 A     4/1978

OTHER PUBLICATIONS

Li, Haifeng et al., Analysis on Subsynchronous Resonance Caused by Series Compensation in AC System Based on Frequency-Scanning and Eigenvalue, Power System Technology, vol. 36, No. 5, May 31, 2012, p. 108-109.

*Primary Examiner* — Jared Fureman
*Assistant Examiner* — Emmanuel Dominique
(74) *Attorney, Agent, or Firm* — Jiwen Chen

(57) ABSTRACT

The present invention discloses a parameter tuning approach for bypass damping filter to suppress subsynchronous resonance in power systems, namely determining the parameters of capacitor, inductor and damping resistor in BDF. Using this approach, the parameters of capacitor and inductor in BDF can be adjusted, so that the frequency where the negative electrical damping of generator reaches minimum can be away from the frequency range of low frequency oscillation mode and typical frequencies of each torsional mode; the parameter of damping resistor in BDF can be further adjusted so that the minimum value of negative electrical damping is in reasonable range. The application of BDF with parameters tuned by the present invention con-
(Continued)

tributes to the suppression of both the torsional interaction effect and the transient torque amplification effect.

5 Claims, 3 Drawing Sheets

(51) Int. Cl.
  *H02J 3/01* (2006.01)
  *H03J 3/22* (2006.01)
  *H04B 15/02* (2006.01)
  *H02H 9/00* (2006.01)
  *H04B 15/00* (2006.01)

(52) U.S. Cl.
  CPC ............... *H03J 3/22* (2013.01); *H04B 15/02* (2013.01); *H04B 15/005* (2013.01)

(56) References Cited

U.S. PATENT DOCUMENTS

| | | | | |
|---|---|---|---|---|
| 2012/0205981 A1* | 8/2012 | Varma | ............. | H02J 3/01 307/64 |
| 2015/0381089 A1* | 12/2015 | Tarnowski | ............. | H02J 3/24 307/84 |
| 2016/0028360 A1* | 1/2016 | English | ............. | G05F 3/16 323/208 |

* cited by examiner

PARAMETER TUNING APPROACH FOR BYPASS DAMPING FILTER TO SUPPRESS SUBSYNCHRONOUS RESONANCE IN POWER SYSTEMS This is a U.S. national stage application of PCT Application No. PCT/CN2016/078929 under 35 U.S.C. 371, filed Apr. 11, 2016 in Chinese, claiming priority of Chinese Application No. 201510350906.0, filed Jun. 19, 2015, all of which are hereby incorporated by reference.

FIELD OF THE INVENTION

The present invention is related to the power system control field, in particular to a parameter tuning approach for bypass damping filter to suppress subsynchronous resonance in power systems.

BACKGROUND ART

Applying a series capacitor in long-distance AC power transmission line is an effective method to increase power transmission capacity and improve transient stability. This has been widely adopted in Chinese large-capacity power transmission projects, such as Togtoh power plant and Yimin power plant in Inner Mongolia province, as well as Jinjie power plant in Shaanxi Province. However, the series-compensated line may lead to torsional interaction of turbine-generator shaft and cause subsynchronous resonance (SSR) problem, which is a severe threat to the generator operation security.

The academic and engineering circles have done plenty of work to solve the SSR problem, including adding auxiliary control signal to the generator excitation system as well as installing block filter between generator and series capacitor. The thyristor-based flexible AC transmission system (FACTS) can also help suppress SSR, provided that the controller is well tuned. However, the parameter tuning approaches for the above-mentioned equipment are quite complex, the suppression effect highly depends on system condition. Besides, the FACTS may inject harmonics into the AC system due to the adoption of thyristor; and its transient response is relatively slow, for the reason that thyristor is triggered once during one period.

Bypass damping filter (BDF) is a kind of filter equipment, which is usually in parallel connection with the series capacitor and is used to suppress SSR. FIG. 1 shows its structure. The parallel combination of the reactor and the capacitor in the BDF is designed to be tuned at the system rated frequency so that its impedance at the rated frequency is high. In normal operation conditions, the BDF carries virtually no currents and does not influence the steady-state operation of system. In transient states, as the impedance of the parallel combination decreases significantly at the subsynchronous frequencies, the BDF acts as a resistive/inductive bypass path for subsynchronous currents and the damping resistor in the BDF has suppression effect on the sub synchronous currents.

SSR has three categories, namely the induction generator effect, torsional interaction and torque amplification. BDF was generally considered particularly effectively for the induction generator effect. This is because at subsynchronous frequencies a synchronous generator performs like an induction generator and hence has negative resistor effect; the negative resistor can be offset to some degree by the damping resistor of BDF. However, so far the positive effect of BDF on suppressing torsional interaction and torque amplification has not been fully recognized, therefore the relevant parameter tuning approach of BDF has not been proposed.

SUMMARY OF THE INVENTION

The present invention provides a parameter tuning approach for bypass damping filter (BDF) to suppress subsynchronous resonance in power systems. In addition to induction generator effect, using this approach the BDF is able to further suppress torsional interaction effect and transient torque amplification effect.

A parameter tuning approach for BDF to suppress sub synchronous resonance in power systems, comprising the following steps:

(1) calculating the typical frequencies of each torsional mode according to the turbine-generator shaft parameters, and suppose the low frequency oscillation mode of the shaft is within the frequency range of 0~2 Hz.

(2) choosing the per-unit frequency where negative electrical damping reaches minimum to be $f_m^*$; the $f_m^*$ should be away from the frequency range of low frequency oscillation mode and typical frequencies of each torsional mode mentioned in Step (1).

(3) according to the chosen $f_m^*$ in Step (2), calculating the per-unit capacitance and reactance $X_{BDF}$ at system rated frequency using the equation below:

$$X_{BDF} = \frac{X_C(X_L - X_C)}{f_e^{*2} X_L - X_C} - X_C$$

$$f_e^* = 1 - f_m^*$$

where $X_L$ is the system per-unit reactance at rated frequency, including generator subtransient reactance, line reactance and equivalent reactance of the receiving power grid; $X_C$ is capacitance of the series capacitor at rated frequency.

(4) calculating the actual physical parameters of the capacitor and the inductor in BDF according to the above-mentioned $X_{BDF}$ in Step (3).

(5) calculating the minimum value of generator negative electrical damping $D_{e(min)}^0$ without BDF applied.

(6) according to the $f_m^*$ in Step (2) and the $X_{BDF}$ in Step (3), calculating the minimum value of generator negative electrical damping $D_{e(min)}^{BDF}$ with BDF applied.

(7) adjusting the value of damping resistor in BDF to make $D_{e(min)}^{BDF}$ in reasonable range.

In a preferred embodiment, the per-unit value of $f_m^*$ can be chosen as the middle frequency between the frequency range from 2 Hz to the lowest typical frequency of the shaft torsional modes. In this way, the excitation of shaft low frequency oscillation mode and torsional modes can be better avoided.

Further, in Step (4) the actual physical parameters of the capacitor and the inductor in BDF are calculated using the following equations:

$$C_{BDF} = \frac{1}{2\pi f_0 Z_B X_{BDF}} \times 10^6 \; \mu F$$

$$L_{BDF} = \frac{Z_B X_{BDF}}{2\pi f_0} \times 10^3 \; mH$$

where $f_0$ is the system rated frequency, $Z_B$ is the base value of system impedance, $C_{BDF}$ and $L_{BDF}$ are the capacitance and inductance of BDF, respectively.

Further, in Step (5) the minimum value of generator negative electrical damping $D_{e(min)}{}^0$ without BDF applied is calculated using the following equation:

$$D_{e(min)}^0 = -\psi_0^2 \frac{1-f_m^0}{2f_m^0} \frac{1}{R}$$

$$f_m^0 = 1 - \sqrt{X_C/X_L}$$

where $\psi_0$ is the per-unit air flux linkage of generator and can be chosen as 1.0 for simplification, R is the per-unit resistance of system.

Further, in Step (6) the minimum value of generator negative electrical damping $D_{e(min)}{}^{BDF}$ with BDF applied is calculated using the following equation:

$$D_{e(min)}^{BDF} = -\psi_0^2 \frac{1-f_m^*}{2f_m^*} \frac{1}{R^*}$$

$$R^* = R + \frac{R_{BDF} X_C^2}{f_e^{*2} R_{BDF}^2 + [k_f^* f_e^* X_{BDF} - X_C]^2}$$

$$k_f^* = \frac{f_e^*}{(1-f_e^{*2})}$$

where $\psi_0$ is the per-unit air flux linkage of generator and can be chosen as 1.0 for simplification, R is the per-unit resistance of system and $R_{BDF}$ is the resistance of the damping resistor in BDF.

Further, in Step (7) the reasonable range of $D_{e(min)}{}^{BDF}$ is chosen as $$D_{e(min)}^0 < D_{e(min)}^{BDF} < D_{e(min)}^0/2$$

Where $D_{e(min)}{}^0$ is minimum value of generator negative electrical damping without BDF applied.

The proposed parameter tuning approach for BDF is able to make the minimum value of generator negative electrical damping appears away from shaft torsional modes and low frequency oscillation mode, and also make the minimum value in reasonable range, hence contributes to suppressing torsional interaction. Besides, the proposed parameter tuning approach also contributes to suppressing transient torque amplification effect, for the reason that the damping resistor of BDF is able to consume the energy of subtransient current, namely the oscillation energy in subsynchronous frequency range.

In summary, the present invention is able to improve the suppression effect of BDF on subsynchronous resonance. To be specific, in addition to suppressing the induction generator effect in traditional sense, the proposed parameter tuning approach can further help BDF to suppress adverse effects of torsional interaction and transient torque amplification on turbine generator shaft.

PREFERRED EMBODIMENTS OF THE INVENTION

The present invention will be described in detail with reference to the accompanying drawings and specific embodiments thereof, in order to more specifically describe the present invention.

Figure 1:
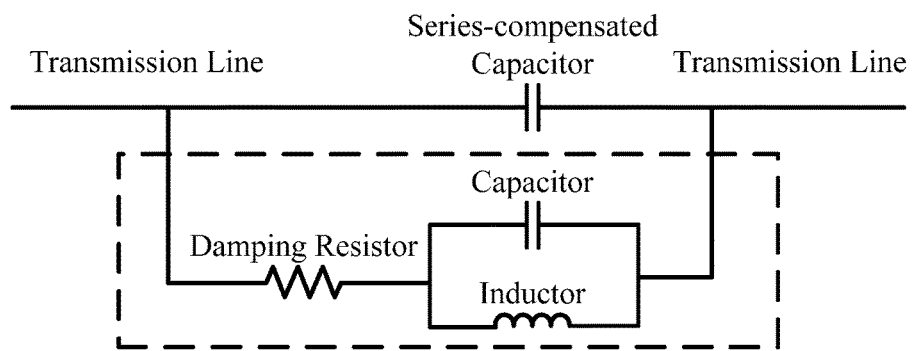
FIG. 1 is a structural diagram of bypass damping filter.
Figure 2:
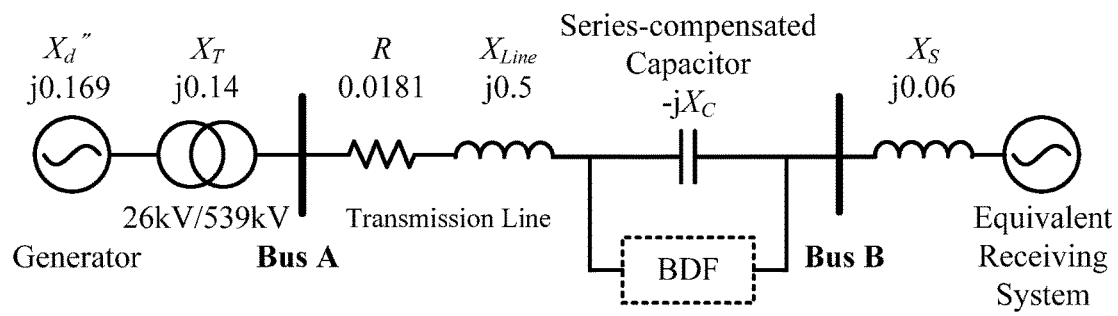
FIG. 2 is a diagram of subsynchronous resonance benchmark model with BDF applied. In the diagram, $X_d''$ is the subtransient reactance of generator, $X_T$ is the leakage reactance of transformer, $X_{Line}$ is the inductive reactance of transmission line, R is the resistance of transmission line, $X_C$ is the capacitive reactance of series capacitor, $X_S$ is the equivalent reactance of receiving power grid.

FIG. 2 is a diagram of subsynchronous resonance benchmark model with BDF applied. The rated frequency of the model is 60 Hz, other electrical parameters are labeled with base impedance value 325.55Ω. The series compensation level is set as 40% (0.20 p.u.). The detailed structure of BDF is shown in FIG. 1.

In this preferred embodiment, the turbine generator shaft has five torsional modes with typical frequency 15.71 Hz, 20.21 Hz, 25.55 Hz, 32.28 Hz and 47.46 Hz. Considering the low frequency oscillation mode is with frequency 0~2 Hz, choose the frequency where negative electrical damping reaches minimum as the middle frequency of the frequency range 2~15.71 Hz, namely $f_m^*$=0.1417 p.u. (8.5 Hz). Noticed that the method of choosing the frequency where negative electrical damping reaches minimum includes but not limited to the method used in the preferred embodiment.

According to the choosing method of BDF capacitor and inductor proposed in the present invention, the per-unit capacitance and reactance $X_{BDF}$ at system rated frequency is calculated as below:

$$X_{BDF} = \frac{X_C(X_L - X_C)}{f_e^{*2} X_L - X_C} - X_C$$

Where $f_e^*$=1−$f_m^*$=0.8583 p.u.; $X_L$ is the system per-unit reactance at rated frequency (including generator subtransient reactance, line reactance and equivalent reactance of the receiving power grid), $X_L$=0.869 p.u.; $X_C$ is capacitance of the series capacitor at rated frequency, $X_C$=0.20 p.u.; The calculation results is listed in Table 1.

TABLE 1

| | |
|---|---|
| $X_{BDF}$/p.u. | 0.1039 |
| Inductor/mH | 89.754 |
| Capacitor/uF | 78.394 |

According to the choosing method of BDF resistor proposed in the present invention, the minimum value of generator negative electrical damping $D_{e(min)}{}^{BDF}$ with BDF applied should satisfy the following relationship.

$$D_{e(min)}^0 < D_{e(min)}^{BDF} < D_{e(min)}^0/2$$

where $D_{e(min)}{}^0$ is the minimum value of generator negative electrical damping without BDF applied. Suppose the per-unit air flux linkage of generator is 1.17 p.u., then $D_{e(min)}{}^0$ cam be calculated as below.

$$f_m^0 = 1 - \sqrt{X_C/X_L} = 0.5203$$

$$D_{e(min)}^0 = -\psi_0^2 \frac{1-f_m^0}{2f_m^0}\frac{1}{R} = -1.17^2 \frac{1-0.5203}{2\times 0.5203}\frac{1}{0.0181} = -34.86$$

As a result, the minimum value of generator negative electrical damping $D_{e(min)}^{BDF}$ with BDF applied should be $-34.86 < D_{e(min)}^{BDF} < -17.43$. In this preferred embodiment, the damping resistor $R_{BDF}$ is chosen as 15Ω (0.0461 p.u.), then $D_{e(min)}^{BDF}$ is calculated as below.

$$f_e^* = 1 - f_m^* = 1 - 0.1417 = 0.8583$$

$$k_f^* = f_e^*/(1 - f_e^{*2}) = 0.8583/(1 - 0.8583^2) = 3.2595$$

$$R^* = R + \frac{R_{BDF}X_C^2}{f_e^{*2}R_{BDF}^2 + [k_f^* f_e^* X_{BDF} - X_C]^2} = 0.2376$$

$$D_{e(min)}^{BDF} = -\psi_0^2 \frac{1-f_m^*}{2f_m^*}\frac{1}{R^*} = -17.45$$

The above-mentioned relationship $-34.86 < D_{e(min)}^{BDF} < -17.43$ is satisfied.

Figure 3:
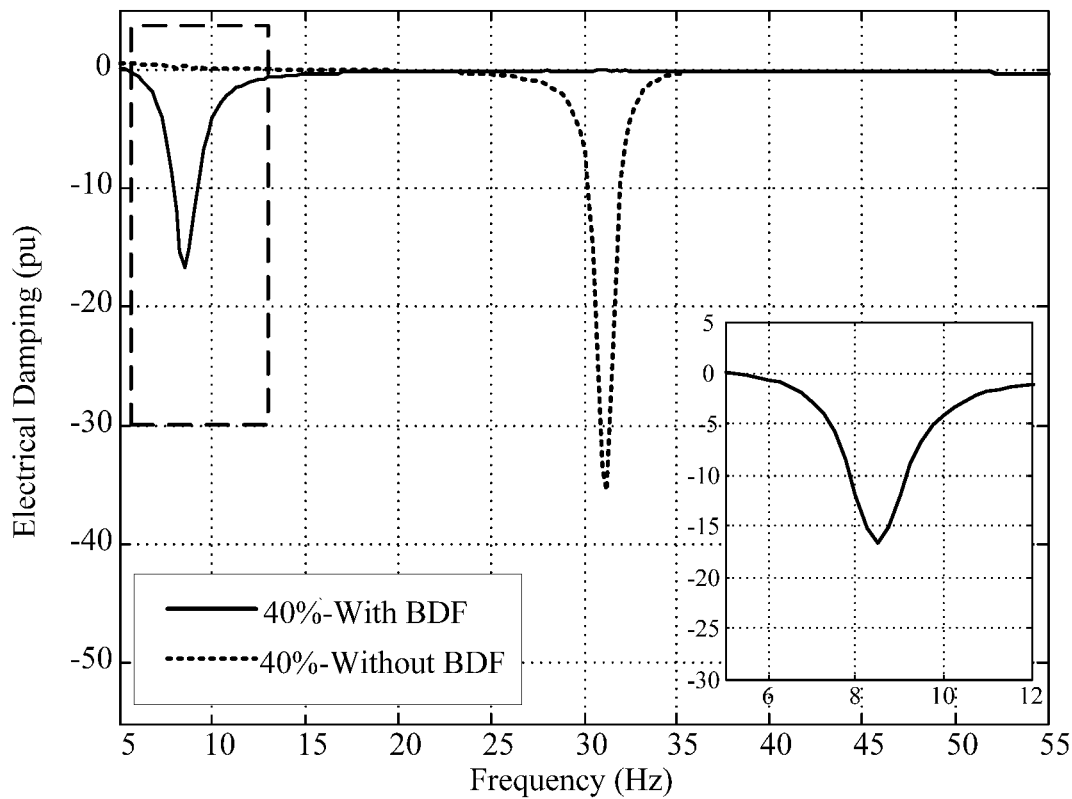
FIG. 3 is a comparison diagram of electrical damping with and without BDF applied under 40% compensation.

For the above-mentioned condition of 40% compensation level, respectively, to further demonstrate the effectiveness of the present invention, the electrical damping of the generator with and without BDF is tested, shown in FIG. 3. Note that the subfigure in FIG. 3 is the amplification diagram of the electrical damping with BDF between 5 Hz and 12 Hz. The comparison result shows that, without BDF applied the negative electrical damping appears within the frequency range of 25~35 Hz, which contributes to the excitation of 25.55 Hz and 32.28 Hz torsional modes. After BDF applied, the negative electrical damping is shifted to about 8.5 Hz, which is away from any of the torsional modes and the low frequency oscillation mode; the shift of the negative electrical damping is helpful for the suppression of torsional interaction. Also note that the minimum value of negative electrical damping is about half of that without BDF.

Figure 4A:
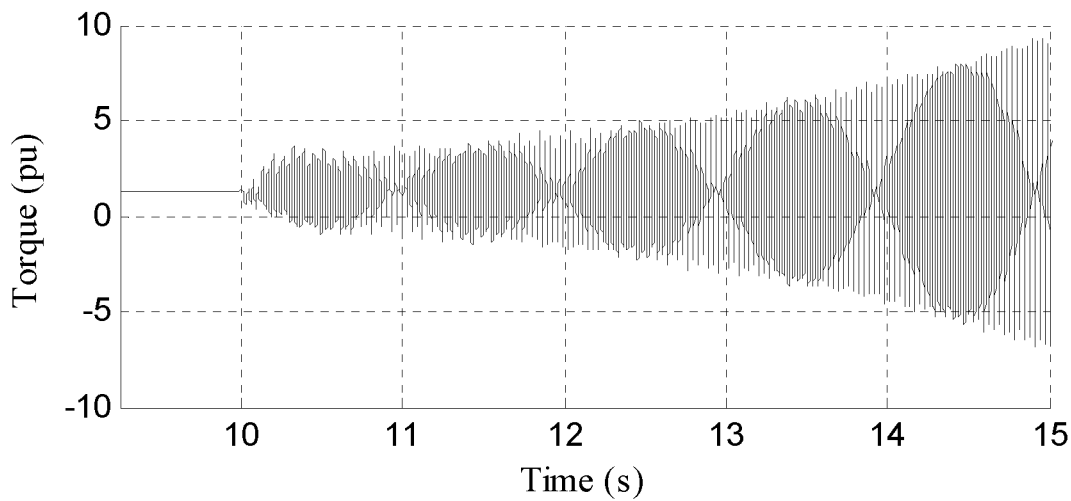
FIG. 4(a) is a diagram of fault response of shaft LPB-GEN segment under 40% compensation without BDF applied.
Figure 4B:
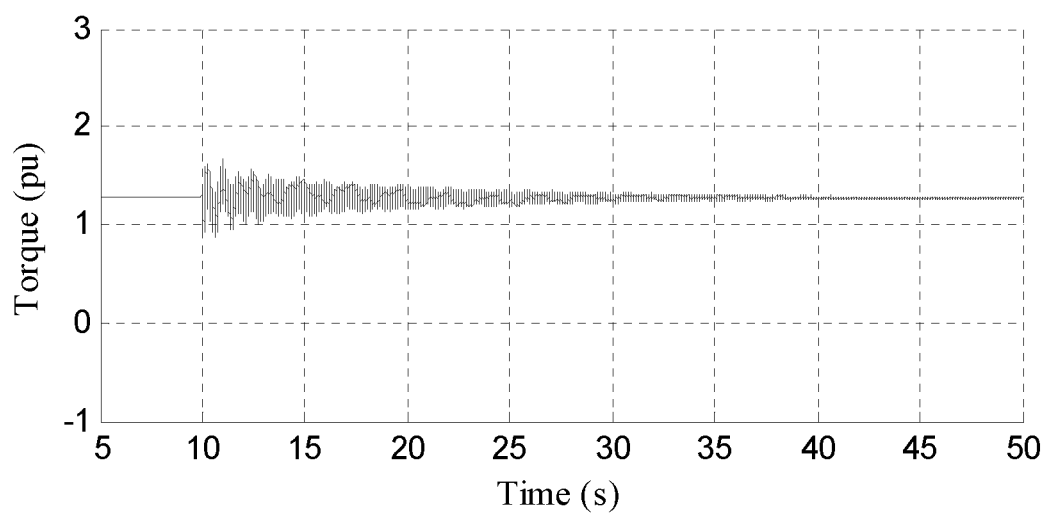
FIG. 4(b) is a diagram of fault response of shaft LPB-GEN segment under 40% compensation with BDF applied.

Time domain simulation of the system is applied, in order to better illustrate the BDF parameter tuning method of the invention on the shaft torsional interaction and transient torque amplification of the inhibition. FIG. 2 bus B at the application of three-phase short-circuit fault, fault clearance time 0.1 s. FIG. 4(a) shows the torque response of the BDF without the BDF, and FIG. 4(b) shows the torque response of the BDF. FIG. 4 (a) shows the torque response of the BDF.

FIG. 4(a) shows that, without BDF applied, the torsional interaction effect of shaft LPB-GEN segment is significantly stimulated. The torque diverges rapidly, which is adverse to the stable operation of shaft. FIG. 4(b) shows that, with BDF applied using the preferred embodiment, the torque of shaft LPB-GEN segment converges rapidly, which means that the torsional interaction is suppressed. Besides, the comparison of FIG. 4(a) and FIG. 4(b) shows that the transient torque decreases significantly with BDF applied; this means that the application of BDF using the preferred embodiment can not only help suppressing torsional interaction, but also contribute to the reduction of transient torque.

The foregoing description of the embodiments is intended to facilitate the understanding and application of the invention by one of ordinary skill in the art. It will be apparent to those skilled in the art that various modifications may be made to the above-described embodiments and that the generic principles set forth herein are applied to other embodiments without the need for creative work. Accordingly, the present invention is not limited to the above-described embodiments, and modifications and modifications of the present invention are intended to be within the scope of the present invention, as disclosed by those skilled in the art in view of the present invention.

The invention claimed is:

1. A parameter tuning method for a bypass damping filter (BDF) to suppress subsynchronous resonance in power systems, comprising the following steps:
   (1) calculating typical frequencies of each torsional mode according to turbine-generator shaft parameters, and supposing a low frequency oscillation mode of the shaft is within a frequency range of 0~2 Hz;
   (2) choosing a per-unit frequency where negative electrical damping reaches minimum to be $f_m^*$, the $f_m^*$ should be away from the frequency range of low frequency oscillation mode and typical frequencies of the each torsional mode mentioned in Step (1);
   (3) according to the chosen $f_m^*$ in Step (2), calculating a per-unit capacitance and reactance $X_{BDF}$ at system rated frequency using the equation below:

$$X_{BDF} = \frac{X_C(X_L - X_C)}{f_e^{*2} X_L - X_C} - X_C$$

$$f_e^* = 1 - f_m^*;$$

where $X_L$ is a system per-unit reactance at rated frequency, including generator subtransient reactance, line reactance and equivalent reactance of the receiving power grid; $X_C$ is capacitance of the series capacitor at rated frequency;
   (4) calculating actual physical parameters of a capacitor and a inductor in BDF according to the above-mentioned $X_{BDF}$ in Step (3);
   (5) calculating a minimum value of generator negative electrical damping $D_{e(min)}^0$ without BDF applied;
   (6) according to the $f_m^*$ in Step (2) and the $X_{BDF}$ in Step (3), calculating the minimum value of generator negative electrical damping $D_{e(min)}^{BDF}$ with BDF applied; and
   (7) adjusting a value of damping resistor in BDF to make $D_{e(min)}^{BDF}$ in a range;
wherein the range of $D_{e(min)}^{BDF}$ in Step (7) is chosen as $$D_{e(min)}^0 < D_{e(min)}^{BDF} < D_{e(min)}^0/2$$

where $D_{e(min)}^0$ is minimum value of generator negative electrical damping without BDF applied.

2. The parameter tuning method for BDF to suppress subsynchronous resonance in power systems according to claim 1, characterized in that the per-unit frequency of $f_m^*$ in Step (2) is chosen as a middle frequency between the frequency range from 2 Hz to the lowest typical frequency of the shaft torsional modes.

3. The parameter tuning method for BDF to suppress subsynchronous resonance in power systems according to claim 1, characterized in that in Step (4) the actual physical parameters of the capacitor and the inductor in BDF are calculated using the following equations:

$$C_{BDF} = \frac{1}{2\pi f_0 Z_B X_{BDF}} \times 10^6 \ \mu F$$

-continued $$L_{BDF} = \frac{Z_B X_{BDF}}{2\pi f_0} \times 10^3 \text{ mH}$$

where $f_0$ is the system rated frequency, $Z_B$ is the base value of system impedance, $C_{BDF}$ and $L_{BDF}$ are the capacitance and inductance of BDF, respectively.

4. The parameter tuning method for BDF to suppress subsynchronous resonance in power systems according to claim 1, characterized in that in Step (5) the minimum value of generator negative electrical damping $D_{e(min)}^0$ without BDF applied is calculated using the following equation:

$$D_{e(min)}^0 = -\psi_0^2 \frac{1-f_m^0}{2f_m^0} \frac{1}{R}$$

$$f_m^0 = 1 - \sqrt{X_C/X_L}$$

where $\psi_0$ is the per-unit air flux linkage of generator and can be chosen as 1.0 for simplification, R is the per-unit resistance of system.

5. The parameter tuning method for BDF to suppress subsynchronous resonance in power systems according to claim 1, characterized in that in Step (6) the minimum value of generator negative electrical damping $D_{e(min)}^{BDF}$ with BDF applied is calculated using the following equation:

$$D_{e(min)}^{BDF} = -\psi_0^2 \frac{1-f_m^*}{2f_m^*} \frac{1}{R^*}$$

$$R^* = R + \frac{R_{BDF} X_C^2}{f_e^{*2} R_{BDF}^2 + [k_f^* f_e^* X_{BDF} - X_C]^2}$$

$$k_f^* = \frac{f_e^*}{(1-f_e^{*2})}$$

where $\psi_0$ is the per-unit air flux linkage of generator and can be chosen as 1.0 for simplification, R is the per-unit resistance of system and $R_{BDF}$ is the resistance of the damping resistor in BDF.

* * * * *